(12) United States Patent
Liang

(10) Patent No.: US 7,045,468 B2
(45) Date of Patent: May 16, 2006

(54) ISOLATED JUNCTION STRUCTURE AND METHOD OF MANUFACTURE

(75) Inventor: Chunlin Liang, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 78 days.

(21) Appl. No.: 10/646,658

(22) Filed: Aug. 21, 2003

(65) Prior Publication Data

US 2004/0038533 A1    Feb. 26, 2004

Related U.S. Application Data

(62) Division of application No. 09/289,424, filed on Apr. 9, 1999, now Pat. No. 6,642,557.

(51) Int. Cl.
*H01L 21/302*    (2006.01)

(52) U.S. Cl. ............... 438/753; 438/294; 438/297; 438/411; 438/422; 438/723; 438/724; 438/756; 438/757

(58) Field of Classification Search ............ 438/39, 438/226, 294, 297, 411, 421, 422, 706, 710, 438/723, 724, 745, 753
See application file for complete search history.

(56) References Cited

U.S. PATENT DOCUMENTS

| 4,503,451 A |   | 3/1985  | Lund et al. |
|-------------|---|---------|-------------|
| 4,803,173 A |   | 2/1989  | Sill et al. |
| 4,888,300 A | * | 12/1989 | Burton ................ 438/404 |
| 5,578,518 A |   | 11/1996 | Koike et al. |
| 5,773,847 A |   | 6/1998  | Hayakawa |
| 5,972,758 A | * | 10/1999 | Liang .................. 438/294 |
| 6,028,333 A |   | 2/2000  | Yamazaki et al. |
| 6,268,637 B1| * | 7/2001  | Gardner et al. ........ 257/522 |

OTHER PUBLICATIONS

Streetman, Solid State Electronic Devices, 1990, Prentice Hall, 3rd ed., pp. 300-301, 324.*
Wolf et al., Silicon Processing for the VLSI Era, 1986, Lattice Press, vol. 1, pp. 280-281.*

* cited by examiner

*Primary Examiner*—Nadine G. Norton
*Assistant Examiner*—Eric B. Chen
(74) *Attorney, Agent, or Firm*—Rahul D. Engineer

(57) ABSTRACT

A MOSFET structure in which the channel region is contiguous with the semiconductor substrate while the source and drain junctions are substantially isolated from the substrate, includes a dielectric volume formed adjacent and subjacent to portions of the source and drain regions.

In a further aspect of the invention, a process for forming an isolated junction in a bulk semiconductor includes forming a dielectric volume adjacent and subjacent to portions of the source and drain regions.

12 Claims, 4 Drawing Sheets

ISOLATED JUNCTION STRUCTURE AND METHOD OF MANUFACTURE

The present patent application is a Divisional of application Ser. No. 09/289,424, filed Apr. 9, 1999, now U.S. Pat. No. 6,642,557 which is hereby incorporated herein by reference.

BACKGROUND OF THE INVENTION

1. Field of the Invention

The invention relates to generally to semiconductor structures and processes, and more particularly to a reduced junction capacitance semiconductor structure and a method of manufacture.

2. Background

Advances in semiconductor process technology and digital system architecture have led to integrated circuits having increased operating frequencies. Unfortunately, higher operating frequencies result in undesirable increases in power consumption. Power consumption is a significant problem in integrated circuit design generally, and particularly in large scale, high speed products such as processors and microprocessors.

Nonetheless, the trend of integrating more functions on a single substrate while operating at ever higher frequencies goes on unabated.

One way to improve integrated circuit performance, is by reducing the loading capacitance of metal-oxide-semiconductor field effect transistors (MOSFETs). Transistor loading capacitance generally has three components, intrinsic gate capacitance, overlap capacitance, and junction capacitance. To reduce junction capacitance, MOSFETs have been constructed on an insulating substrate. This is often referred to as silicon-on-insulator (SOI). Typical SOI processes reduce junction capacitance by isolating junctions from the substrate by interposing a thick buried oxide layer. However, short-channel MOSFETs constructed with thick buried oxide layers isolating their junctions from the substrate, tend to have poor punch-through characteristics, poor short-channel characteristics and other effects related to the floating body.

What is needed is a semiconductor structure having reduced junction capacitance and while maintaining good device characteristics. What is further needed is a method of manufacturing such a semiconductor structure.

SUMMARY OF THE INVENTION

Briefly, a MOSFET structure in which the channel region is contiguous with the semiconductor substrate while the source and drain junctions are substantially isolated from the substrate, includes a dielectric volume formed adjacent and subjacent to portions of the source and drain regions.

In a further aspect of the invention, a process for forming an isolated junction in a bulk semiconductor includes forming a dielectric volume adjacent and subjacent to portions of the source and drain regions.

BRIEF DESCRIPTION OF THE DRAWINGS

FIG. 2($b$) is a schematic cross-sectional view, in the channel length direction, of an alternative embodiment of the present invention wherein a field effect transistor has source and drain junctions that are isolated from the body.

FIG. 2($c$) is a schematic cross-sectional view, in the channel width direction, of the field effect transistor shown in FIG. 2($b$).

DETAILED DESCRIPTION

Terminology

Figure 1:
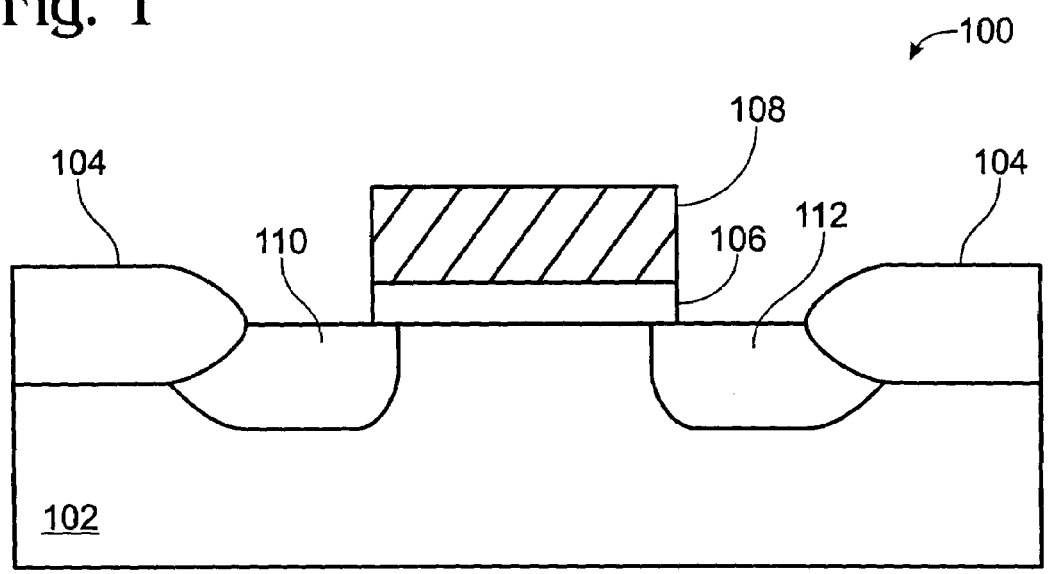
FIG. 1 is a cross-sectional view, in the channel length direction, of a conventional field effect transistor.

The terms, chip, integrated circuit, monolithic device, semiconductor device, and microelectronic device, are often used interchangeably in this field. The present invention is applicable to all the above as they are generally understood in the field.

The terms metal line, interconnect line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally aluminum (Al), an alloy of Al and copper (Cu), or Cu, are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal suicides are examples of other conductors.

Overview

Previously known SOI structures have isolated MOSFETs entirely from the bulk substrate by forming a thick buried oxide layer between the MOSFET and the substrate. However, the thick buried oxide layer prevents the electric field originating at the drain junction from terminating in the substrate. Instead the field extends to the source junction. This results in poor punch-through and short-channel characteristics for short-channel SOI MOSFETs. Additionally, a fully isolated SOI MOSFET suffers from the floating body effect and therefore integrated circuits built with these transistors are less stable in operation than those built with conventional transistors. The floating body effect occurs when the body node is not tied to a particular voltage and therefore the threshold voltage, Vt, of transistors in the body fluctuate as charge is coupled in and out of the floating node during operation. Because this coupling effect is typically time-dependent, the floating body effect also contributes to transient and hysteresis phenomena.

The present invention overcomes these problems with a structure, as well as a method for fabricating this structure, wherein the structure includes a junction isolation region that substantially reduces parasitic junction capacitance in MOSFETs while maintaining a physically contiguous connection between the MOSFET channel region and the body region in a bulk semiconductor substrate.

Structure

Referring to FIG. 2($a$), an example of an isolated junction structure in accordance with the present invention is shown wherein the source and drain regions of MOSFETs are surrounded by junction isolation regions. The junction isolation regions are located adjacent and subjacent the source and drain regions.

More particularly, a substrate 202 has pedestals 206 integrally formed therein. Pedestals 206 are T-shaped when viewed in cross-section. T-shaped pedestals 206 have a stem portion and a top portion. MOSFETs in accordance with the present invention include a gate insulator 208 superjacent the top portion of T-shaped pedestals 206, and a gate electrode 210 overlying the gate insulator. Distal ends of the top portion of T-shaped pedestals 206 which are not covered by gate 210, are implanted with impurities to form source/drain junctions 204. Gate insulator 208 is typically a silicon oxide, gate electrode 210 is typically polysilicon. Source/drain junctions 204 can include p-type dopants such as boron, or n-type dopants such as arsenic or phosphorous.

Figure 2A:
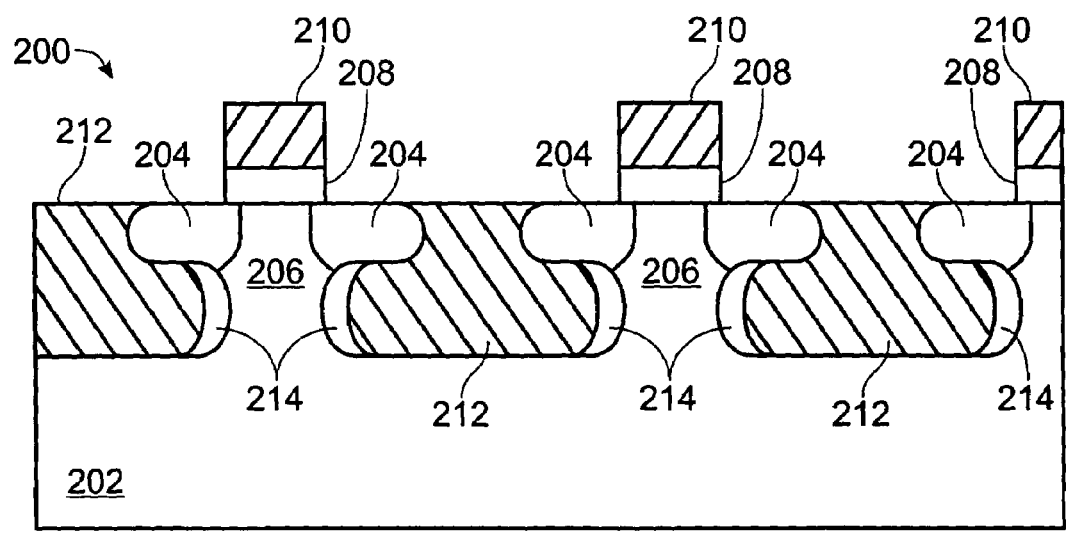
FIG. 2($a$) is a schematic cross-sectional view, in the channel length direction, of a field effect transistor where the source and drain junctions are isolated from the body in accordance with the present invention.

The space adjacent and subjacent source/drain regions 204 electrically isolates the junctions from substrate 202 and is referred to herein as the junction isolation region. By isolating source/drain junctions 204 from substrate 202, the parasitic junction capacitance, conventionally associated with reversed biased junctions, is substantially reduced. This junction isolation region is typically filled, at least partially, with a dielectric to provide mechanical strength for layers subsequently formed in the course of manufacturing an integrated circuit. As shown in FIG. 2(a), the junction isolation region is partially filled with an electrically insulating material 212. Air gaps 214 are formed under source/drain junctions 204 and adjacent to the stem portion of T-shaped pedestals 206, as shown in FIG. 2(a).

Figure 2B:
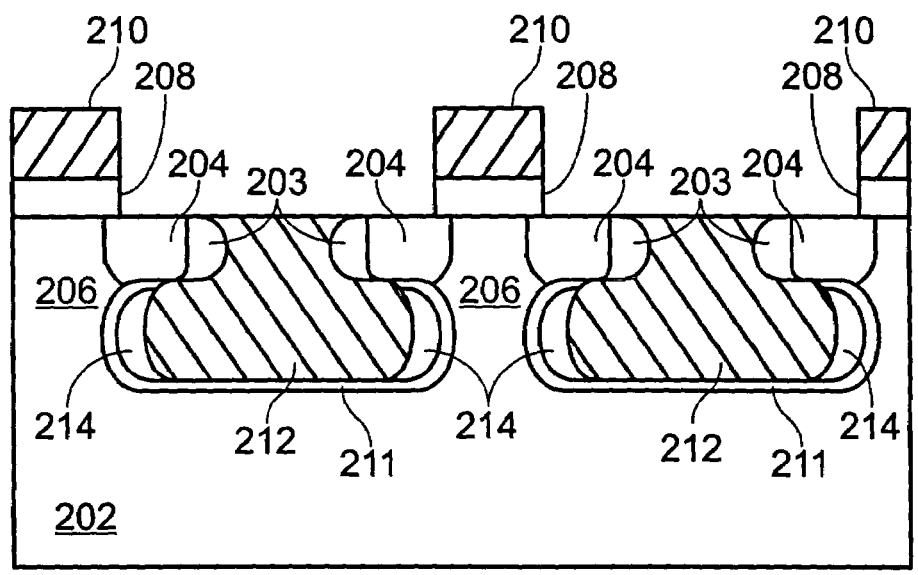

Referring to FIG. 2(b), an alternative embodiment of an isolated junction structure in accordance with the present invention is shown which is similar to the embodiment of FIG. 2(a), except that an oxide liner 211 is present on the inner surfaces of the junction isolation regions, and a nitride spacer 203 is adjacent each distal end of the top portions of the T-shaped pedestal.

Those skilled in the art having the benefit of this disclosure will appreciate that numerous variations of the inventive junction isolation structure are possible, for example, oxide liner 211 may be present and nitride spacer 203 may be absent. Alternatively, nitride spacer 203 may be present and oxide liner 211 may be absent. In further alternative embodiments, other materials, for example silicon oxides, can be used to form the spacers. In still further alternative embodiments, the junction isolation region may be formed along particular portions of the source/drain region rather than around its entire perimeter.

Figure 2C:
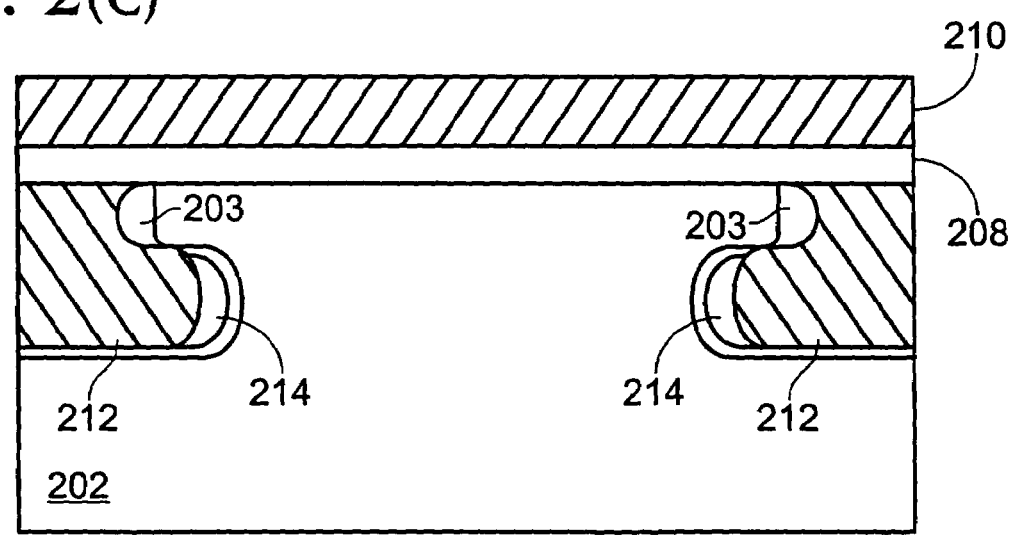

FIG. 2(c) shows a different cross-sectional view of the embodiment of the present invention shown in FIG. 2(b). This view is across the channel width direction of the MOSFET. As shown, the junction isolation structure also provides a region that undercuts the channel portion of the MOSFET. Trench fill material 212 provides structural support of the gate extensions. Gate extensions are those portions of the gate electrode material that extend past the edges of the source/drain region in the channel width direction.

Process

Referring to FIGS. 3(a)–(i), an exemplary process flow in accordance with the present invention is described.

Figure 3A:
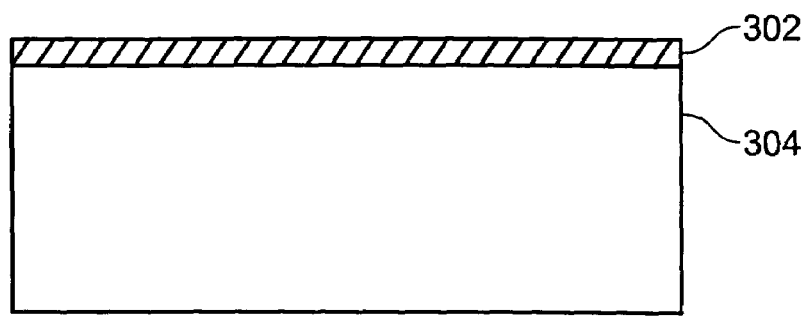
FIGS. 3($a$)–($i$) are schematic cross-sectional views illustrating the various stages of manufacturing a field effect transistor having an isolated junction structure.
Figure 3B:
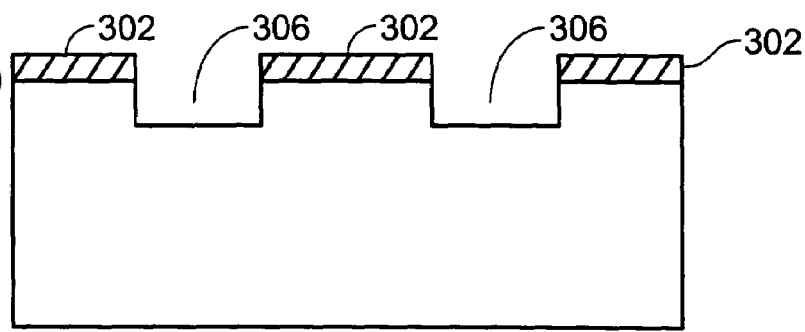

As shown in FIG. 3(a), a silicon dioxide layer 302 is deposited over a starting silicon substrate 304. Silicon dioxide layer 302 is then patterned for trench isolation, as shown in FIG. 3(b). The patterned silicon dioxide is used as an etching mask. A first section 306 of a shallow trench is etched into silicon substrate 304 using patterned silicon dioxide layer 302 as etch barrier, i.e., mask. The depth of first section 306 of the trench is approximately the same as the desired depth of the junction that will be formed in a subsequent operation.

Figure 3C:
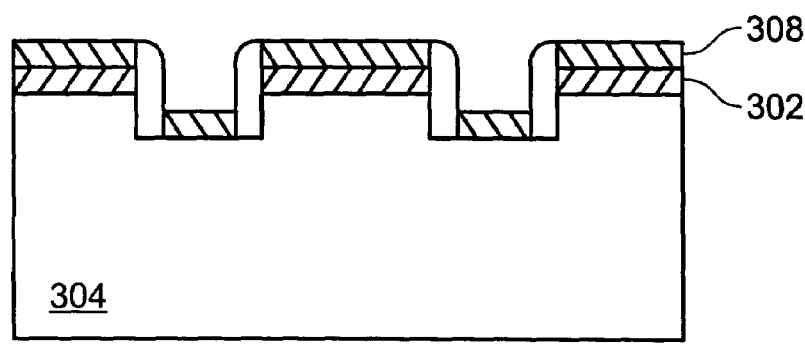
Figure 3D:
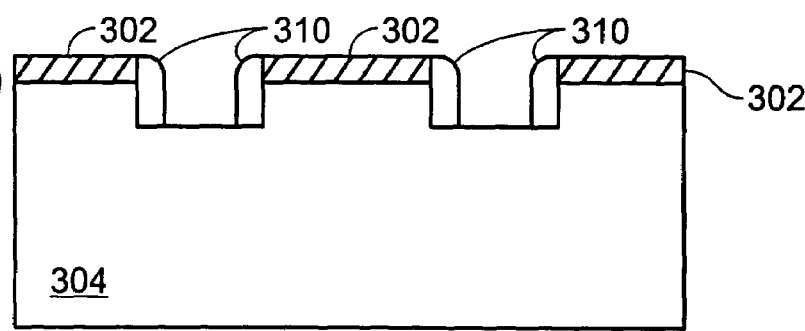

Subsequently, as shown in FIG. 3(c), a silicon nitride layer 308 is conformably deposited on the exposed trench structure. Silicon nitride layer 308 is typically formed by chemical vapor deposition. An an isotropic etch of silicon nitride layer 308 is performed to produce a SiN spacer 310 on the edge of the trench, but with the bottom Si substrate exposed, as shown in FIG. 3(d).

Figure 3E:
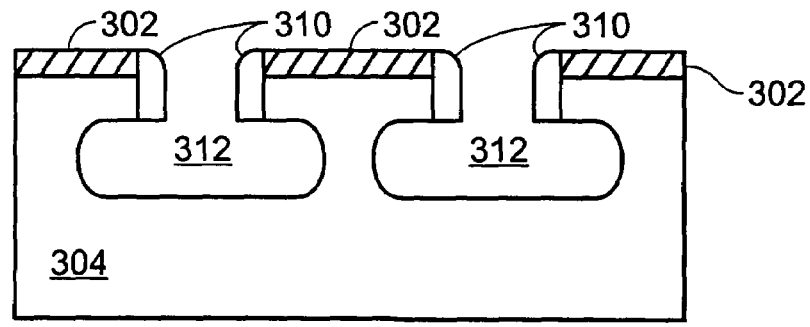

A Si selective isotropic etch is then performed to produce an undercut region 312, as shown in FIG. 3(e). This etch can be done either as a wet etch, a dry etch or a combination of the two. At this point in the process, SiN spacer 310 can be removed if desired, or it can be left and the process continued.

An advantage of removing the SiN spacer is that this tends to open up the trench opening so the subsequent filling will be easier. A second advantage of removing the SiN spacer is that SiN tends to produce a stress on Si that is greater than SiO induced stress, and therefore removal of the SiN spacer layer will likely reduce this film stress. A third advantage of removing the SiN spacer is that SiN has a higher dielectric constant than SiO and therefore tends to increase inter-line coupling capacitance. However, as will be recognized by those skilled in the art having the benefit of this disclosure, all these advantages need to be traded-off with the advantage of fewer processing steps, and less contamination of lateral trench, which are achieved by leaving the SiN spacers in place.

Figure 3F:
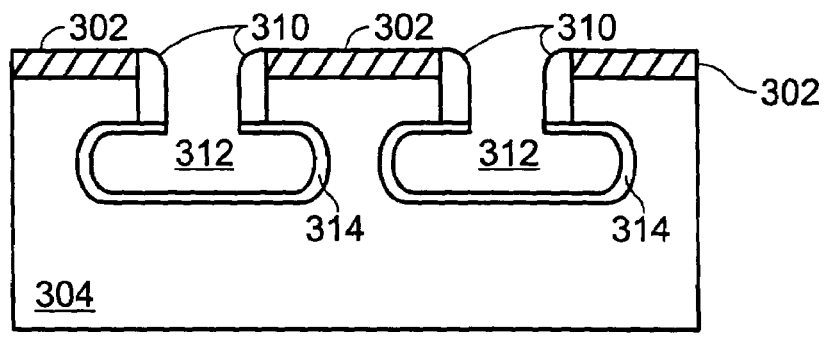

The trench is then cleaned. Cleaning of the trench is important so that any residual etchant will be removed, as the corrosive effect of the etchant on silicon substrate 304 can lead to reliability problems. If the undercut region 312 of the trenches have been formed by wet etching then moisture is likely to have been trapped and the trench must be completely dried. Drying of trapped moisture can be accomplished by heating the substrate in an inert gas such as nitrogen. Subsequently, a thermal oxidation is performed to produce a protective oxide 314 over the inner surface of the trench structure, as can be seen in FIG. 3(f).

Figure 3G:
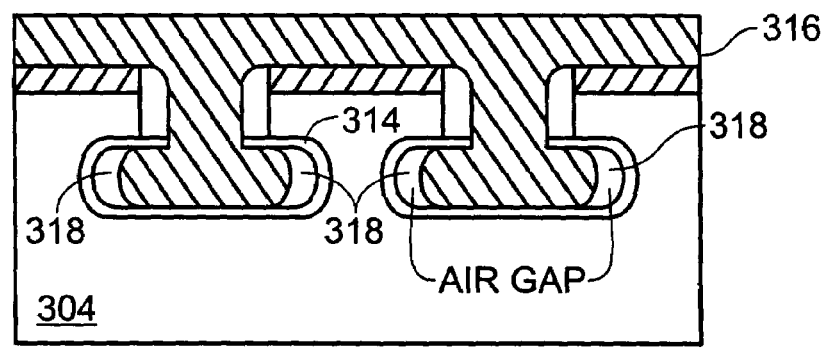

The trench is then filled, typically with an oxide of silicon 316, using conventional trench filling processes. However, it is not necessary to fill all of undercut region 312. By leaving an air gap 318 within undercut region 312, as shown in FIG. 3(g), a greater reduction in junction capacitance is achieved. This is because the dielectric constant of air is lower than that of the oxides of silicon.

Figure 3H:
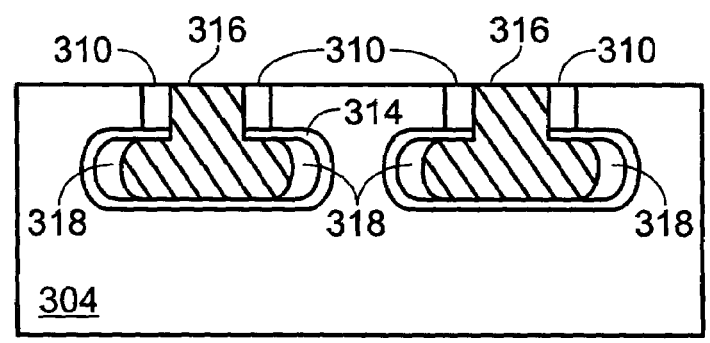
Figure 3I:
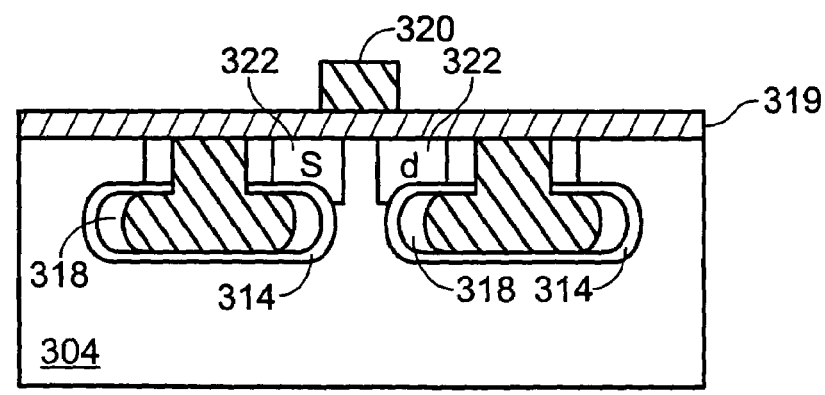

After the trench fill is performed, the surface is planarized, as shown in FIG. 3(h). Planarization is typically achieved either by etch back or chemical mechanical polishing (CMP). Subsequent to planarization of the surface, conventional processing steps can be used to form a gate insulator layer 319, gate electrode 320 and doped source/drain region 322 as shown in FIG. 3(i). In this way a MOSFET is formed having reduced junction capacitance.

CONCLUSION

Embodiments of the present invention include a junction isolation structure that substantially reduces parasitic junction capacitance in MOSFETs while maintaining a physically contiguous connection between the MOSFET channel region and the substrate region in a bulk semiconductor.

An advantage of the present invention is that parasitic capacitance associated with MOSFET source and drain junctions is reduced. As a consequence of reduced junction capacitance, integrated circuit embodying the present invention can be operated at higher frequencies without requiring additional power. Similarly, such integrated circuits can be operated at lower power because the need to charge and discharge parasitic capacitances has been obviated.

It will be understood by those skilled in the art having the benefit of this disclosure that the present invention can be embodied in various structures and process steps other than those of the illustrative embodiment. For example, alternative trench fill materials such as low dielectric constant polymers, or undoped polysilicon can be used. Similarly, silicon oxide and silicon nitride can be interchanged as masking and spacer material.

It will be understood that various other changes in the details, materials, and arrangements of the parts and steps which have been described and illustrated in order to explain the nature of this invention may be made by those skilled in the art without departing from the principles and scope of the invention as expressed in the subjoined claims.

What is claimed is:

1. A method of forming an isolated junction field effect transistor comprising:
   a) depositing a layer of trench masking material on a surface of a semiconductor substrate;
   b) patterning the layer of trench masking material to expose portions of the semiconductor substrate;
   c) etching the semiconductor substrate to form at least a first trench and a second trench, wherein each of the first and second trenches has a bottom surface and a side surface;
   d) depositing a conformal layer of spacer material;
   e) forming spacers adjacent to the side surfaces of the first trench and the second trench by anisotropically etching the spacer material until the semiconductor substrate at the bottom surface of each of the first and second trenches is exposed;
   f) integrally forming a T-shaped pedestal in the semiconductor substrate by isotropically etching the exposed semiconductor substrate to form a first undercut region subjacent to the first trench and a second undercut region subjacent to the second trench, wherein a top portion of the T-shaped pedestal is disposed between the first trench and the second trench and a stem portion of the T-shaped pedestal is disposed between the first undercut region and the second undercut region;
   g) filling each of the first and second trenches with at least one dielectric material;
   h) forming a gate insulator layer;
   i) forming a gate electrode over the gate insulator layer; and
   j) implanting impurities to form a source and a drain region.

2. The method of claim 1, wherein the depth of each trench is substantially equal to a predetermined junction depth.

3. The method of claim 1, wherein the depth of each trench is greater than a predetermined junction depth.

4. The method of claim 1, wherein the spacer layer material is a material selected from the group consisting of silicon oxide and silicon nitride.

5. The method of claim 1, wherein filling each of the first and second trenches with at least one dielectric material comprises partially filling the first and second undercut regions with an oxide of silicon such that an air gap exists adjacent the stem portion of the T-shaped pedestal.

6. The method of claim 1, further comprising, prior to the step of filling each of the first and second trenches with at least one dielectric material, removing the spacers.

7. The method of claim 1, further comprising, prior to the step of filling each of the first and second trenches with at least one dielectric material, thermally oxidizing inner surfaces of the first and second undercut regions so as to form an oxide liner.

8. The method of claim 1, wherein the gate insulator comprises an oxide of silicon.

9. The method of claim 1, wherein the gate electrode comprises polysilicon.

10. The method of claim 1, wherein the source and drain regions are doped with p type ions.

11. The method of claim 1, wherein the source and drain regions are doped with n type ions.

12. A method of forming an isolated junction comprising:
   a) lining vertical sidewalls of a first trench and a second trench formed in a surface of a semiconductor substrate with a spacer material;
   b) isotropically etching the first trench and the second trench with an etchant that is more selective for the semiconductor substrate than for the spacer material, to form a first undercut region subjacent to the first trench and a second undercut region subjacent to the second trench, wherein the first undercut region is isolated from the second undercut region by a portion of the semiconductor substrate;
   c) removing the remaining spacer material;
   d) oxidizing the inner surfaces of the first and second undercut regions;
   e) forming air gaps in the first and second undercut regions by partially filling the first and second undercut regions with insulation material; and
   f) implanting impurities into a portion of the semiconductor material that overlies the first and second undercut regions.

* * * * *